(12) United States Patent
Cheng et al.

(10) Patent No.: US 8,053,823 B2
(45) Date of Patent: Nov. 8, 2011

(54) SIMPLIFIED BURIED PLATE STRUCTURE AND PROCESS FOR SEMICONDUCTOR-ON-INSULATOR CHIP

(75) Inventors: Kangguo Cheng, Ossining, NY (US); Ramachandra Divakaruni, Ossining, NY (US); Herbert L. Ho, New Windsor, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 1273 days.

(21) Appl. No.: 10/906,808

(22) Filed: Mar. 8, 2005

(65) Prior Publication Data

US 2006/0202249 A1   Sep. 14, 2006

(51) Int. Cl.
*H01L 27/108* (2006.01)
(52) U.S. Cl. ......... 257/302; 257/E21.396; 257/E21.653; 257/E27.112
(58) Field of Classification Search .................. 257/347, 257/300, 301, 304, 296, 510, 513, 520, E21.396, 257/E21.652, E21.653, E21.703, E21.112, 257/E29.346
See application file for complete search history.

(56) References Cited

U.S. PATENT DOCUMENTS

| | | | |
|---|---|---|---|
| 5,661,320 A * | 8/1997 | Moriya | 257/296 |
| 6,552,381 B2 | 4/2003 | Chittipeddi et al. | |
| 6,635,915 B2 | 10/2003 | Kokubun | |
| 7,015,526 B2 * | 3/2006 | Bonart | 257/296 |
| 2004/0036097 A1 * | 2/2004 | Ping et al. | 257/296 |
| 2004/0135187 A1 | 7/2004 | Bonart | |
| 2005/0260859 A1 * | 11/2005 | Deshpande et al. | 438/719 |

* cited by examiner

*Primary Examiner* — Tom Thomas
*Assistant Examiner* — Dilinh Nguyen
(74) *Attorney, Agent, or Firm* — H. Daniel Schnurmann; Daryl K. Neff

(57) ABSTRACT

A structure is provided herein which includes an array of trench capacitors having at least portions disposed below a buried oxide layer of an SOI substrate. Each trench capacitor shares a common unitary buried capacitor plate which includes at least a portion of a first unitary semiconductor region disposed below the buried oxide layer. An upper boundary of the buried capacitor plate defines a plane parallel to a major surface of the substrate which extends laterally throughout the array of trench capacitors. In a particular embodiment, which starts from either an SOI or a bulk substrate, trenches of the array and a contact hole are formed simultaneously, such that the contact hole extends to substantially the same depth as the trenches. The contact hole preferably has substantially greater width than the trenches such that the conductive contact via can be formed simultaneously by processing used to form trench capacitors extending along walls of the trenches.

11 Claims, 12 Drawing Sheets

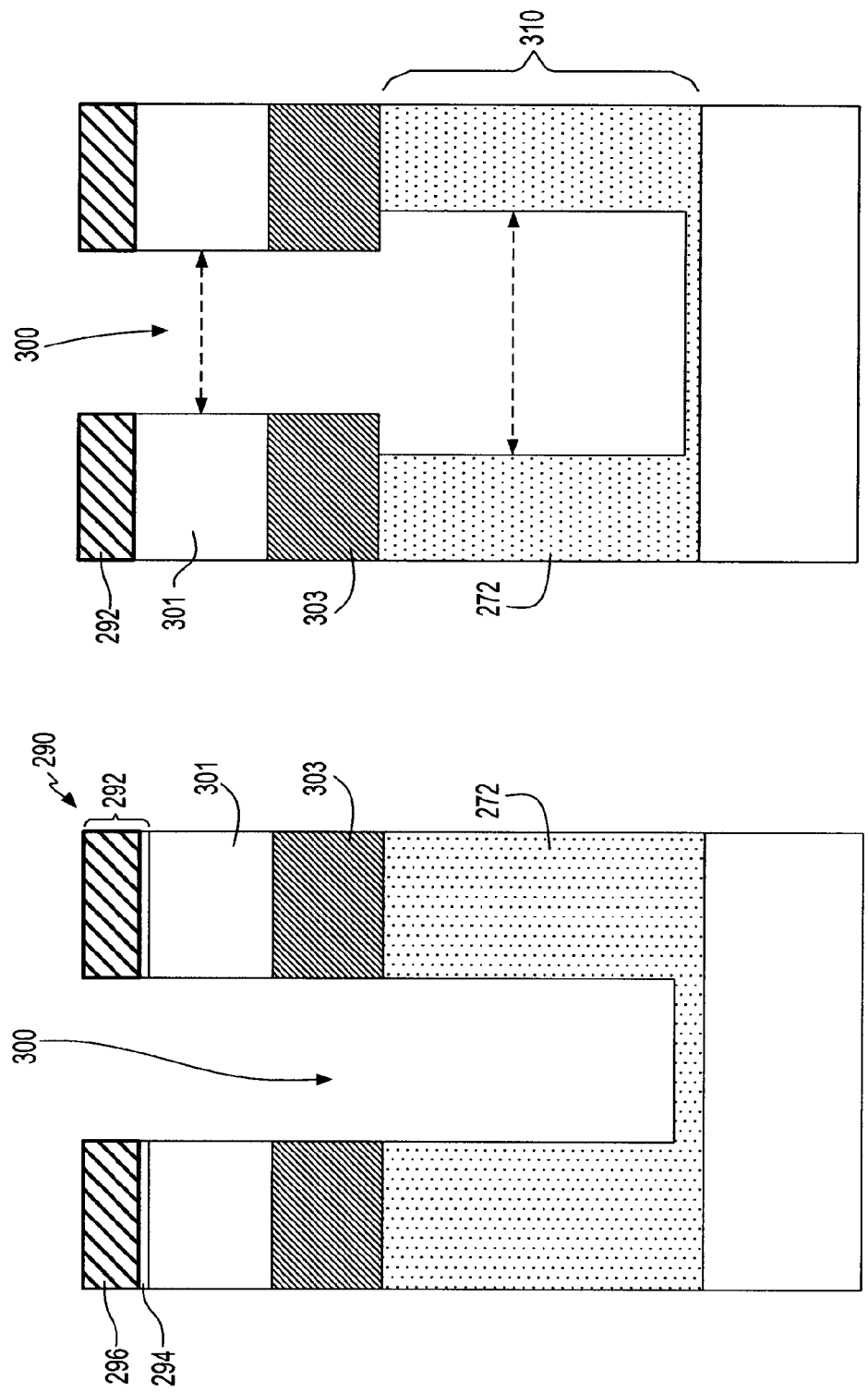

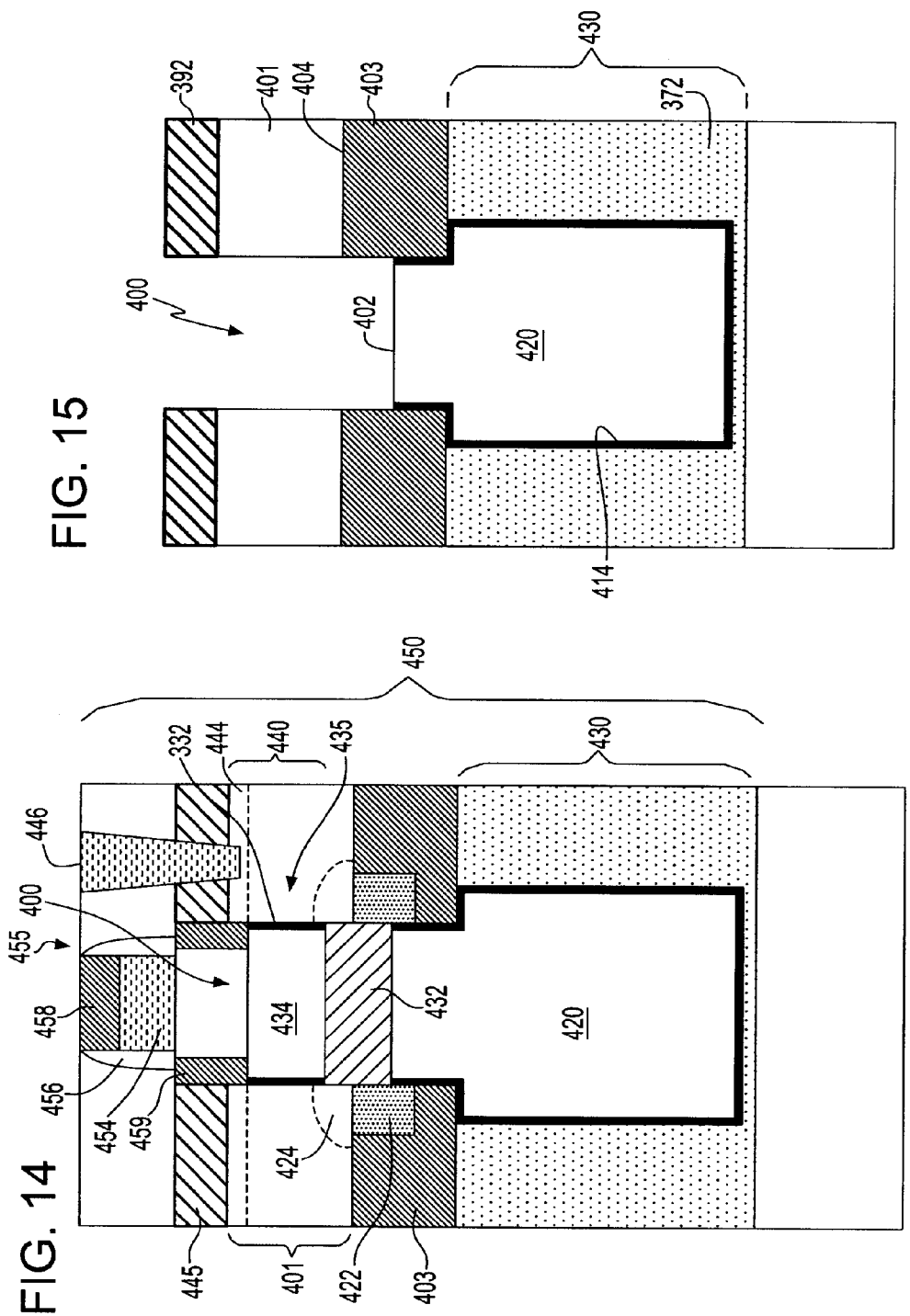

SIMPLIFIED BURIED PLATE STRUCTURE AND PROCESS FOR SEMICONDUCTOR-ON-INSULATOR CHIP

BACKGROUND OF THE INVENTION

The present invention relates to semiconductor devices and processing, and more particularly to a structure and method of providing a buried plate for an array of trench capacitors in a semiconductor-on-insulator chip.

Some types of semiconductor chips include capacitors that are referred to as "trench capacitors" because at least part of the capacitor is formed within a trench that extends into the interior of a semiconductor substrate. Such capacitors are advantageously used because they take up relatively little area of the surface of the substrate in relation to the amount of capacitance they provide. Trench capacitors also include a capacitor dielectric, often called a "node dielectric", which extends along a sidewall of the trench. Frequently, one of the conductive plates of the capacitor is an inner plate provided inside the trench. Another one of the conductive plates is an outer plate extending along the sidewall of the trench on a side of the capacitor dielectric opposite the conductive plate inside the trench. Most typically, the inner plate, also referred to as a "node electrode", is the plate on which a variable voltage is maintained from one point in time to another. The inner plate is subject to being charged or discharged during operation, while the outer plate is typically held at a constant voltage.

The outer plate is often provided as a region of doped semiconductor material in the exterior region of the substrate surrounding the trench, in which case the second conductive plate is referred to as a "buried capacitor plate" or "buried plate". In order to maintain the buried plate at a constant voltage during operation, the buried plate must be connected through a conductive contact structure to an external source of potential. In some earlier techniques of fabricating trench capacitors, the function of the buried plate is provided by a bulk semiconductor region of the substrate which has a uniform p-type dopant concentration, in which case such conductive contact can be provided through a direct contact to any exposed surface of the bulk semiconductor region.

However, in more recent techniques, the buried plate is provided as an n-type doped region in the immediate vicinity of the sidewall of the trench, such buried plate being conductively connected to the buried plates of other trench capacitors by a laterally extending, vertically confined n-type doped region of the semiconductor substrate referred to as an "n-band." In order to form maintain the buried plates of such trench capacitors at a constant potential, a conductive contact structure must be provided which extends from a surface of the substrate into the vertically confined n-band found below the surface.

Conventionally, the formation of a buried plate, the n-band and a conductive contact structure contacting the n-band have required a complicated and relatively expensive fabrication process. This is particularly true when trench capacitors are provided in semiconductor-on-insulator substrates, such as silicon-on-insulator (SOI) substrates. Such complicated processing is best understood with reference to the stages of processing in a prior art method illustrated in FIGS. 1 and 2. As shown in FIG. 1, an SOI substrate 10 has a plurality of trenches 12 extending downwardly from a major surface 14 of the substrate through a silicon-on-insulator (SOI) layer 16, a buried oxide layer 18, and at least somewhat into a p-type doped bulk region 20 of the substrate. An insulating dielectric 22 covers the major surface 14 of the substrate 10.

Trench capacitors are formed which extend along sidewalls of each of the trenches 12 in the following way. Trenches 12 are etched into the substrate, after which a buried plate 24 of each trench capacitor is formed within the bulk semiconductor region surrounding each trench 12 but not within the SOI layer 16 by outdiffusion of an n-type dopant from inside each trench. During such processing, the SOI layer 16 is protected from unwanted outdiffusion of the n-type dopant. Thereafter, the node dielectric 26 and node electrode 28 of each trench capacitor 30 are formed, which completes the individual trench capacitors.

However, further processing is still required to form the n-band 32 and the conductive contact structure. Typically, the n-band 32 is formed after completing the trench capacitors by implanting an n-type dopant into a vertically confined and laterally extending region of the semiconductor substrate. Such processing requires the formation of a patterned mask layer above the insulating layer 22 on the substrate, the patterned mask layer permitting a high energy ion implant to proceed into the region of the n-band 32 while at the same time protecting other portions of the semiconductor substrate from damage.

In addition, either subsequently or prior thereto, a conductive contact via 34 as shown in FIG. 2 must be formed to extend from a position at or above the major surface 14 of the substrate 10, through the SOI layer 16, the buried oxide layer 18, and into the bulk region 20 and n-band 32 that connects the buried plates 24 of the trench capacitors. The formation of the conductive contact via requires the formation and photo-lithographic patterning of an additional patterned mask layer, typically a hard mask layer, above the major surface 14 of the substrate. Thereafter, a contact hole is etched through the insulating layer 22, the SOI layer 16, the BOX layer 18, and into the n-band region 32 of the bulk region 20 of the substrate. Subsequently, the contact hole is filled with a conductive material such as n+ doped polysilicon to form the conductive contact structure 34. As apparent from the foregoing, not only is separate masking required to form the conductive contact structure, but a separate step is required to conductively fill the contact structure from that used to form the node electrodes 28 of the trench capacitors 30 (FIG. 1), as well as a separate step to etch back or planarize the conductive fill to the top surface of the substrate. Such methods of forming the buried plate, n-band and conductive contact structure are not only complicated, involving many dedicated processing steps, but are also expensive. The two mask levels produce difficulties relating to process control, potential misalignment of the masks, and inevitable defects resulting therefrom.

Accordingly, it would be desirable to provide a less complicated, less expensive way of forming a structure in which the buried plates of an array of trench capacitors are tied to a common potential available at a surface of the substrate.

SUMMARY OF THE INVENTION

According to a first aspect of the invention, a structure is provided which includes an array of trench capacitors. Within such structure, a semiconductor-on-insulator substrate includes a semiconductor-on-insulator ("SOI") layer, a buried oxide ("BOX") layer underlying the SOI layer and a buried semiconductor region underlying the BOX layer, the buried semiconductor region including a laterally extending first unitary semiconductor region. An array of trench capacitors has at least portions disposed below the BOX layer. Each trench capacitor includes a node dielectric layer extending along an inner wall of a trench disposed within the first unitary semiconductor region. Each trench capacitor shares a common unitary buried capacitor plate which includes at least a portion of the first unitary semiconductor region. The unitary buried capacitor plate has a first single conductivity type selected from n-type and p-type, wherein at least an upper boundary of the buried capacitor plate defines a plane which extends laterally throughout the array and parallel to a major surface of the substrate.

According to another aspect of the invention, a structure is provided which includes an array of trench capacitors. The structure includes a substrate which includes a semiconductor region, and an array of trench capacitors. Each trench capacitor includes a node dielectric layer extending along an inner wall of a trench disposed within the semiconductor region. Each trench capacitor shares a common unitary buried capacitor plate which has only a first single conductivity type, being either n-type or p-type conductivity. The structure additionally includes a conductive contact via extending into the semiconductor region, in which the conductive contact via has a depth that is substantially equal to a depth of the trench capacitors.

According to yet another aspect of the invention, a method is provided for forming a structure including an array of trench capacitors. Such method includes steps of: a) providing a substrate including a semiconductor region; b) etching an array of trenches into the semiconductor region; c) etching a contact hole into the semiconductor region, the contact hole having a depth substantially equal to a depth of the trenches; d) forming trench capacitors extending along inner walls of the trenches, each trench capacitor sharing a common unitary buried capacitor plate including at least a portion of the semiconductor region, the common unitary buried capacitor plate having only a first single conductivity type selected from n-type and p-type; and e) forming a contact via within the contact hole, the contact via conductively contacting the unitary buried capacitor plate.

BRIEF DESCRIPTION OF THE DRAWINGS

FIGS. 6 through 13 illustrate a structure and method of forming a memory cell of an array of memory cells in accordance with a second embodiment of the invention.

FIGS. 14-17 illustrate a structure and method of forming a memory cell of an array of memory cells in accordance with a third embodiment of the invention.

DETAILED DESCRIPTION

Figure 3:
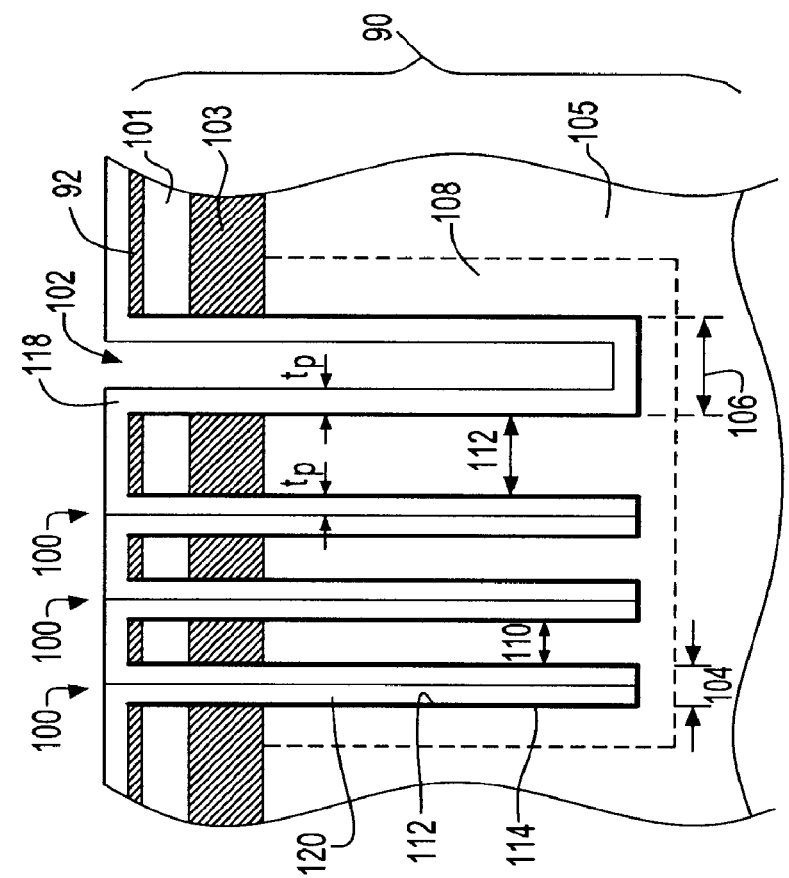

Referring to FIG. 3, a first method of forming a buried plate while simultaneously forming a conductive via contacting the buried plate will now be described. FIG. 3 illustrates an early stage of processing. As shown therein, an array of trenches 100 has been etched into a semiconductor-on-insulator substrate 90 having a sacrificial pad structure 92 (illustratively including a pad nitride overlying a relatively thin pad oxide), a semiconductor-on-insulator ("SOI") layer 101, a buried insulator or buried oxide ("BOX") layer 103 and a bulk semiconductor layer 105. A contact hole 102 has also been etched into the substrate 90. The trenches 100 and the contact hole 102 are etched simultaneously by the same processing, which illustratively includes a reactive ion etch (RIE) performed through one or more hard mask layers which have been previously patterned by prior photolithographic patterning and etching. The trenches, which are illustratively processed subsequently to form trench capacitors of a dynamic random access memory (DRAM) or embedded DRAM array, have a maximum diameter 104 that is quite small in order to meet the density goals for the memory array. For example, in a particular embodiment, the maximum diameter 104 of each trench is less than or about 100 nm. By comparison, the minimum diameter 106 of the contact hole 102 is substantially greater than the maximum diameter 104 of the trenches 100, the reason for which will become apparent as described below. For example, the minimum diameter 106 of the contact hole 102 has a value which is about 20% or more larger than the maximum diameter 104 of the trenches.

After the trenches 100 and contact hole 102 have been etched, a unitary, merged buried plate 108 is formed within the bulk semiconductor region of the substrate by local outdiffusion of an n-type dopant from inside the trenches 100 and contact hole 102 into the portion of the bulk semiconductor region surrounding each of the trenches 100 and the contact hole 102. A combination of factors must cooperate to achieve such result. First, the spacing 110 between adjacent trenches 100 and between the contact hole 102 and the trench 100 adjacent thereto must be maintained relatively small, for example, preferably less than about 200 nm, more preferably less than 150 nm, and most preferably less than or equal to the size of the maximum diameter 104 of the trenches 100, for example, about 100 nm or less. In addition, the outdiffusion process must be conducted in a manner that produces the required dopant distribution. For example, a dopant source such as arsenic doped glass or gas phase arsenic doping which provides a large concentration of dopants can be provided to an inner sidewall of each trench 100 and the substrate is then heated to a degree sufficient to drive dopants from the dopant source into the surrounding bulk region to form the merged unitary buried plate 108. Such step of heating can either be performed by heating the substrate 90 to a high, non-melting temperature for a relatively short period of time, or alternatively, by heating the substrate to a temperature which aids dopant diffusion, and then maintaining the substrate at such temperature until a desired dopant penetration has been achieved.

Thereafter, as further shown in FIG. 3, a capacitor dielectric, also known as a "node dielectric" 112 is formed on a sidewall 114 of each trench 100 by blanket depositing a dielectric layer having a selected material. Preferably, the node dielectric is formed by deposition of silicon dioxide, silicon nitride, or some combination of layers of silicon dioxide and silicon nitride. Alternatively, the node dielectric can be formed by deposition of a "high-K" (high dielectric constant) dielectric material such as hafnium-based high-k dielectric ($HfO_2$, HfON, or HfSiON), tantalum oxide ($Ta_2O_5$), aluminum oxide ($Al_2O_3$), a ferroelectric dielectric material, zeolites, a perovskite material, lead zirconium titanate ("PZT") or any other high dielectric constant material. During this deposition step, the node dielectric 112 is also deposited into the trenches 100 and contact hole 102.

After the node dielectric 112 has been formed in the trenches 100 and contact hole 102, a layer of conducting material 118, preferably polysilicon having a heavy n-type dopant concentration, is deposited to overlie the node dielectric 112 within each trench. Deposition conditions are selected such that the thickness $t_P$ of the deposited layer of polysilicon 118 reaches at least half the diameter of each trench 100, thus causing the layer of polysilicon within each trench 100 to merge into one more or less continuous node electrode layer 120 therein. However, owing to the larger diameter 106 of the contact hole 102, the deposited polysilicon layer 118 within the hole 102 does not merge into one continuous structure filling the contact hole 102.

Figure 1:
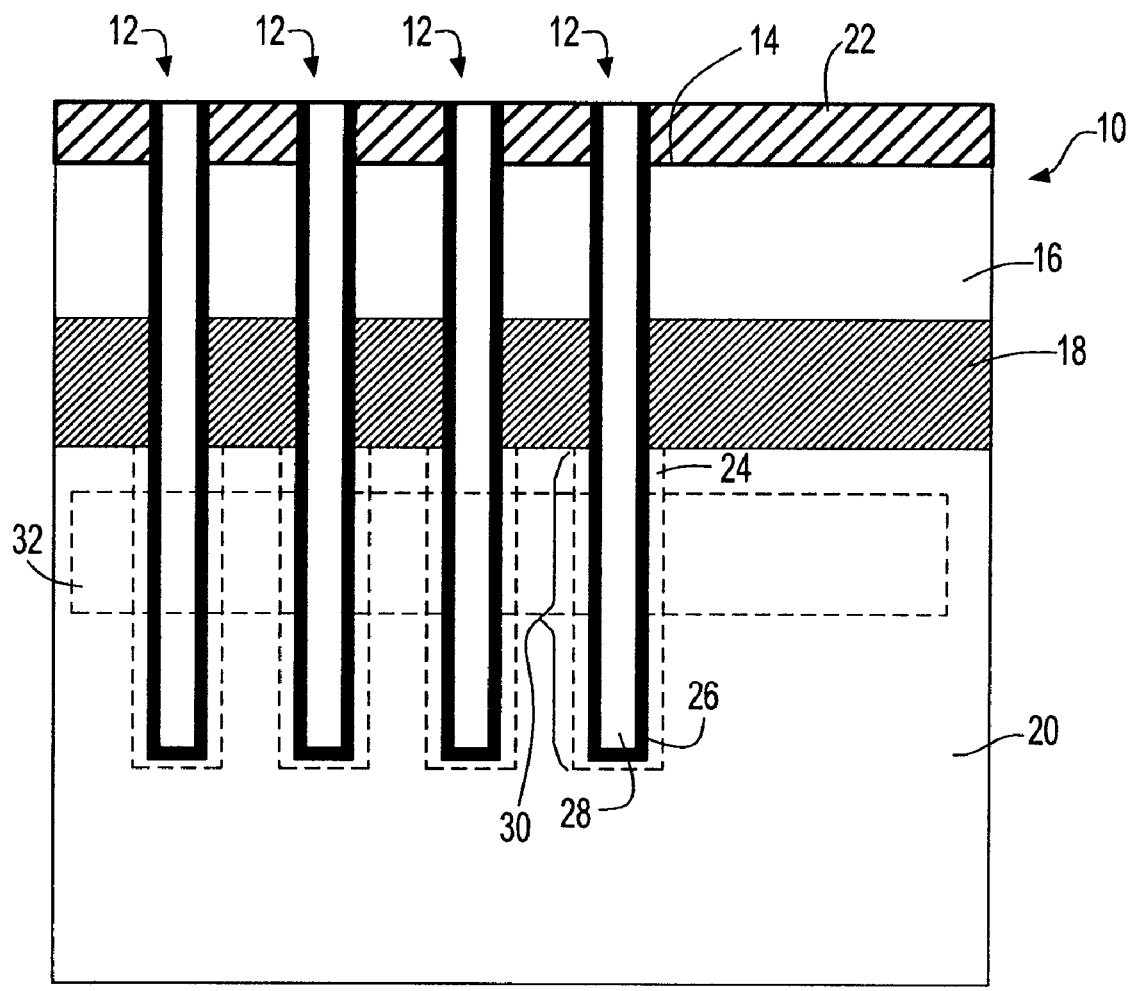
FIGS. 1-2 are diagrams illustrating a prior art structure and method of forming an array of trench capacitors including a buried plate region and conductive contact thereto.
Figure 2:
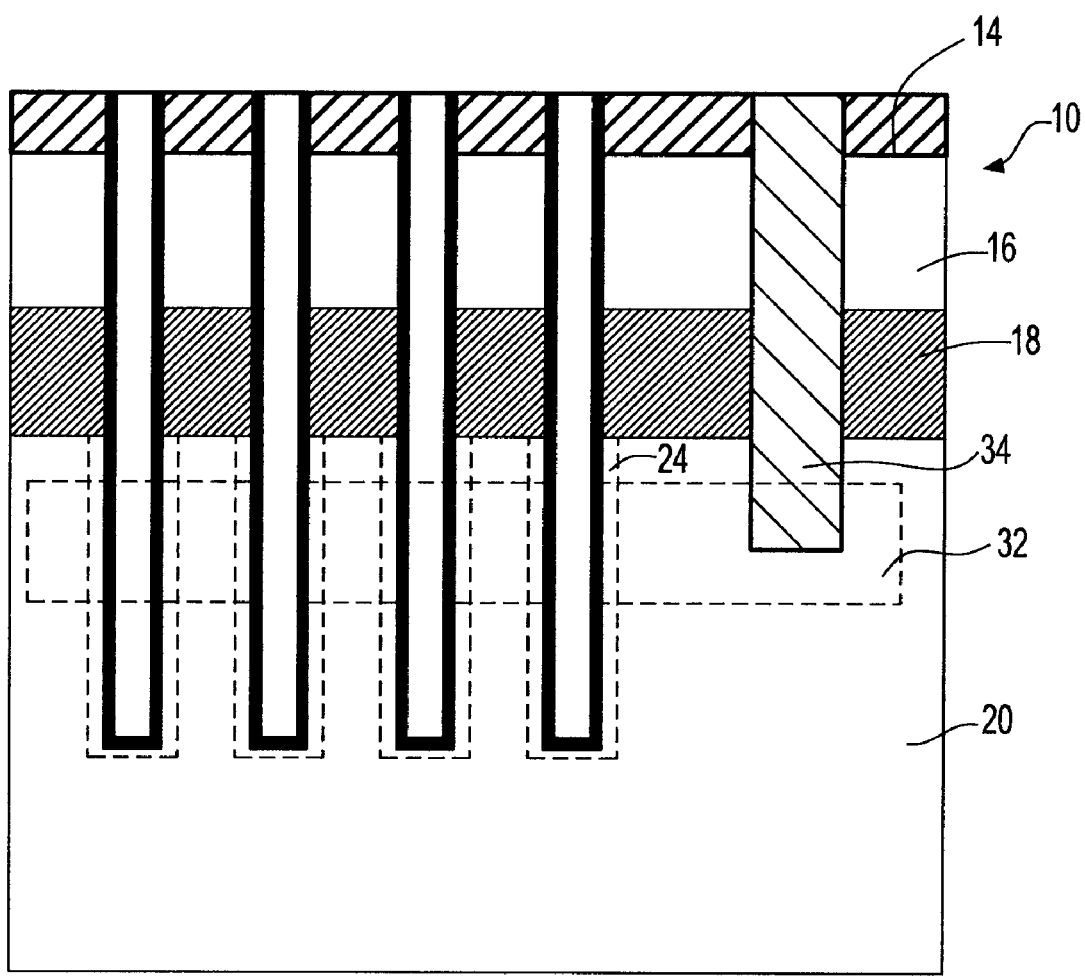
Figure 4:
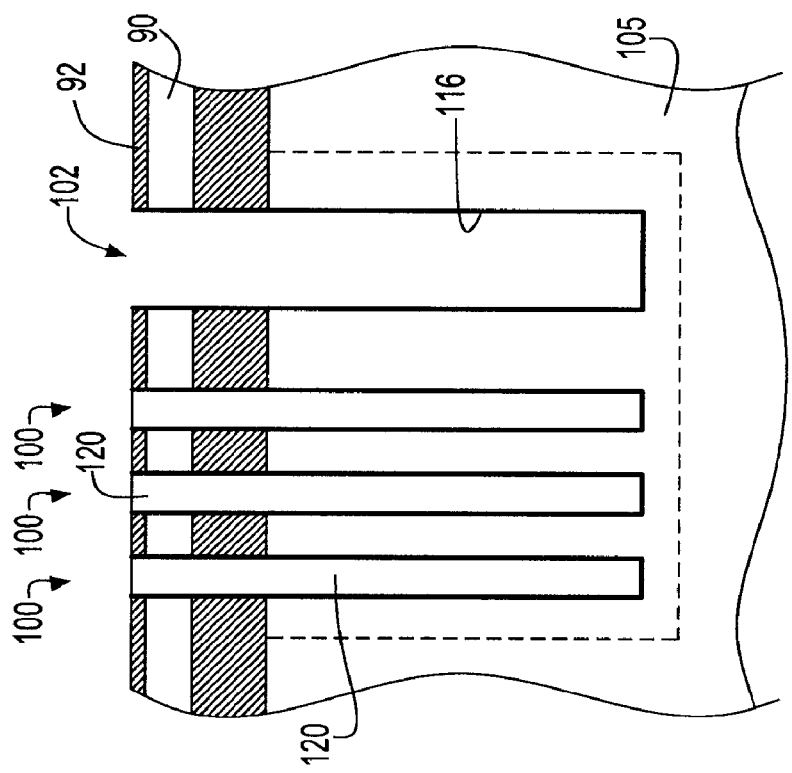
FIGS. 3 through 5 illustrate a structure and method of forming an array of trench capacitors in accordance with a first embodiment of the invention.

In a subsequent stage of processing shown in FIG. 4, the deposited polysilicon is etched back from the area overlying the pad structure 92 on the surface of the substrate 90. As a result, the deposited polysilicon is removed from within the contact hole 102, while the deposited polysilicon remains within the trenches 100 as a node electrode. Thereafter, the node dielectric is also removed. In one embodiment, the node dielectric is removed entirely from the contact hole 102, such as by etching the material of the node dielectric selectively to the material of the bulk semiconductor region 105 present at the sidewall and selectively to polysilicon or other conductive fill material 120 that is disposed within the trenches 100. For example, a wet etching process containing hydrofluoric and ethylene glycol (HF/EG) can be used when the node dielectric is comprised of silicon nitride or silicon oxynitride. During this etch process, by virtue of the selective nature of the etch process, the conductive fill 120 is preserved within the trenches. In addition, the node dielectric 112 is also protected from etching by the conductive fill 120.

Alternatively, the node dielectric material is removed only from the bottom of the contact hole 102, leaving a layer of node dielectric on the sidewall of the contact hole. In this case, a dry etch process such as reactive ion etching (RIE) can be used to remove the node dielectric material.

Alternatively, the node dielectric material is removed entirely from the contact hole 102, followed by forming a spacer (not shown) on at least the upper potion of the sidewall or on the entire sidewall of the contact hole 102.

Alternatively, the sidewall of the contact hole 102 is isolated from the SOI layer by one or more insulating materials such as provided by shallow trench isolation.

Figure 5:
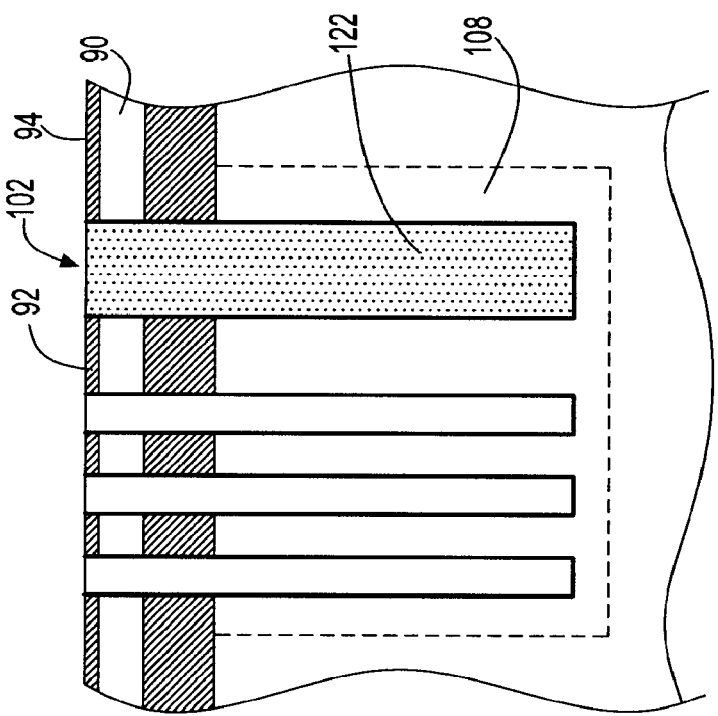

Thereafter, as shown in FIG. 5, a conductive fill 122 is deposited to fill the contact hole 102, after which the conductive fill is planarized to the top surface 94 of the pad structure 92, as by chemical mechanical polishing ("CMP") or other suitable planarization techniques. Preferably, the conductive fill is a polysilicon fill 122 consisting essentially of an n+ doped polysilicon. In such case, a conductive barrier layer (not shown) such as an ultra-thin (<10 Angstroms) silicon nitride layer or silicon carbide layer is preferably deposited to line the sidewall and the bottom of the contact hole 102 prior to depositing the polysilicon fill 122. The conductive barrier layer functions to prevent the polysilicon fill 122 within the contact hole 102 from crystallizing, which could generate crystal defects at the bottom and/or the sidewall of the contact hole 102.

Figure 6:
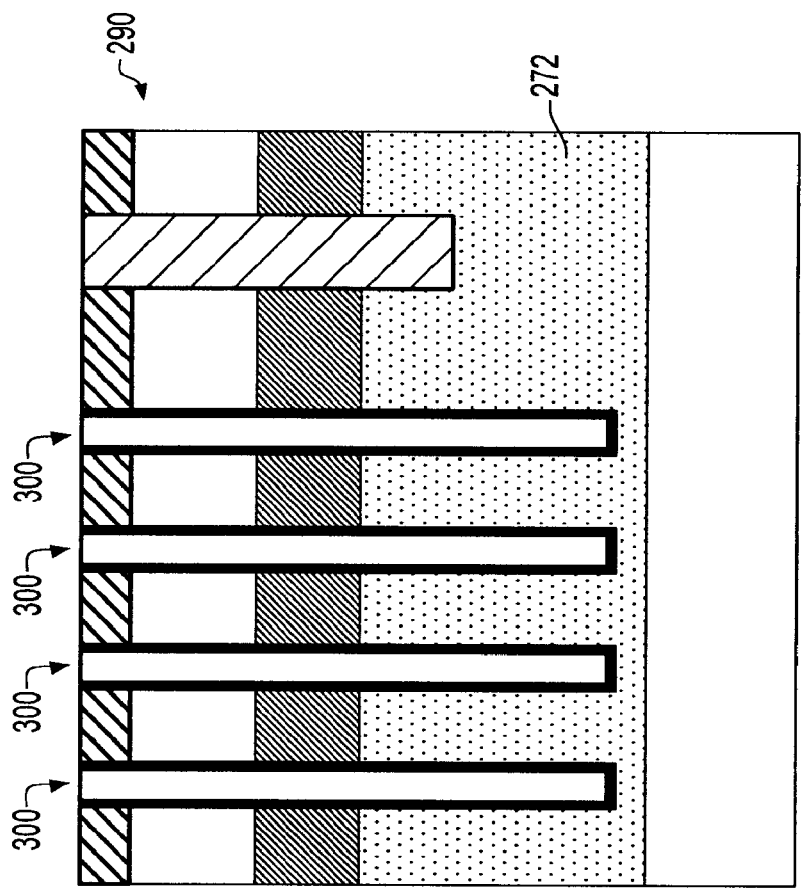

FIGS. 6 through 13 illustrate an alternative embodiment of the invention. As shown in FIG. 6, in this embodiment, an n-type doped layer 272 of a semiconductor-on-insulator (SOI) substrate 290 is formed prior to the trenches being etched. Such layer 272 functions as a unitary buried plate layer 272 for an array of trench capacitors 300 which extend into the unitary buried plate layer 272. The unitary buried plate layer 272 is formed during steps performed to form the initial SOI substrate. In such alternative embodiment, steps taken to form the buried plate as described above with reference to FIGS. 3-5 are advantageously eliminated. As a result, constraints imposed on the spacing between trenches and heating of the substrate to drive dopants from sources inside the trenches into the buried plate are eliminated in this embodiment.

Figure 7:
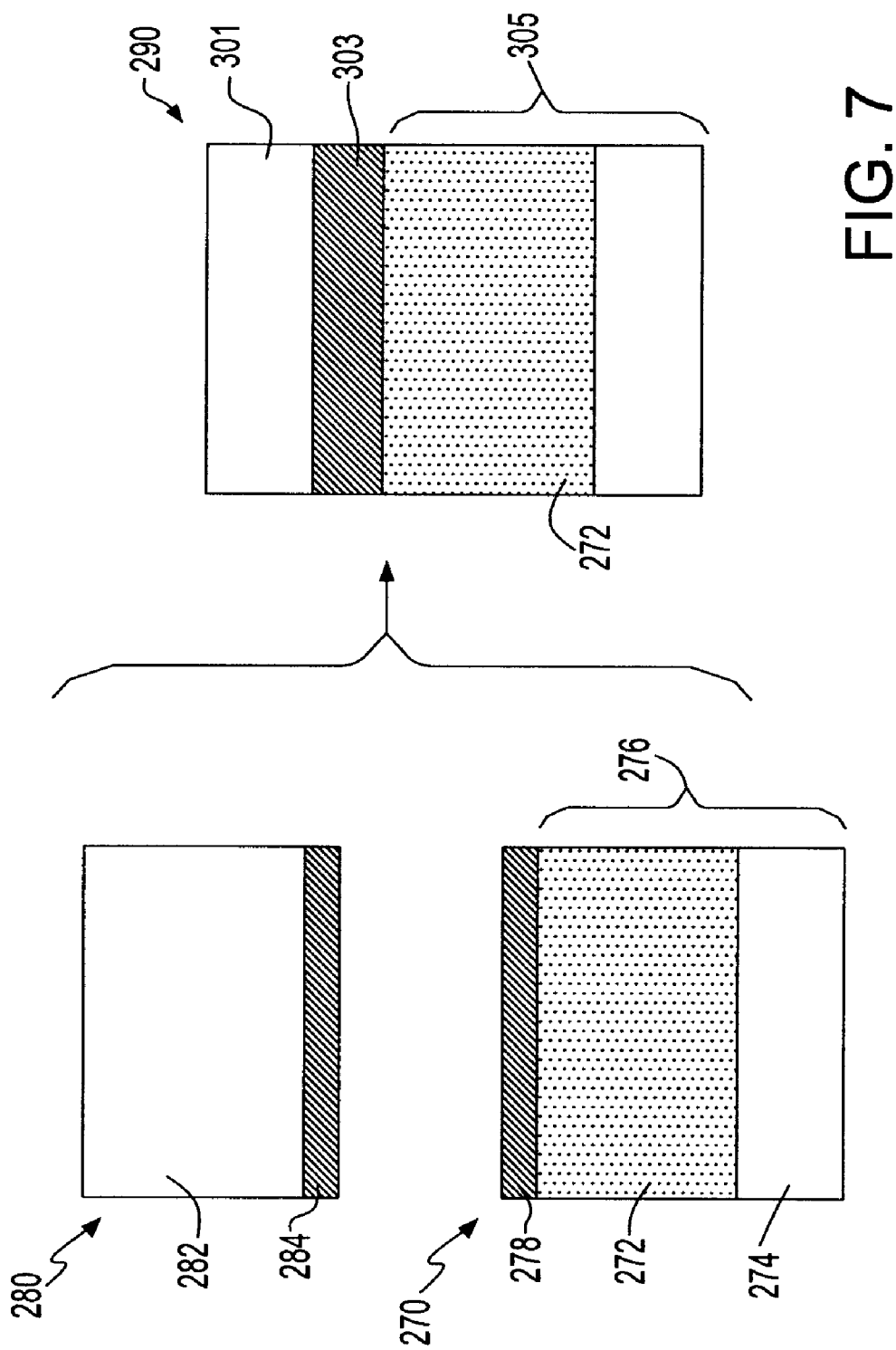

FIG. 7 illustrates one method of forming the initial SOI substrate 290 through a process of bonding a base wafer 270 to a bond wafer 280. As shown therein, a base wafer 270 includes a unitary n+ type doped layer 272 which will later form the buried capacitor plate. Optionally, as shown in FIG. 7, the n-type doped layer 272 is disposed above an intrinsic or p-type doped base region 274, such that the n-type doped layer 272 and the p-type doped base region 274 together make up the bulk region 276 of the base wafer 270. Alternatively, the intrinsic or p-type doped base region can be omitted and the n+ type doped layer can make up the entire bulk region 276 of the base wafer.

In the former option, the n-type doped layer 272 can be formed by epitaxial growth of a single crystal semiconductor on top of the p-type doped base region 274. For example, silicon or silicon germanium can be epitaxially grown on top of silicon. Alternatively, the n-type doped layer consists essentially of n-type heavily doped polycrystalline silicon or silicon germanium formed by a conventional deposition technique such as low-pressure chemical vapor deposition (LPCVD), rapid thermal chemical vapor deposition (RTCVD), or plasma-enhanced chemical vapor deposition (PECVD). The base wafer 270 further includes an insulating layer 278 overlying the n-type doped layer 272, the insulating layer 278 (hereinafter referred to as "oxide layer 278") preferably consisting essentially of an oxide of the semiconductor provided in the n-type doped layer, preferably being silicon dioxide. The n-type doped layer 272 is preferably at least somewhat (e.g., a few hundred nanometers nm or more) thicker than the maximum etch depth of the trenches within the bulk region 276 including a process tolerance, in order to assure that the n-type doped layer 272 functions as a buried plate over the entire length of the trench which extends into that layer.

The bond wafer 280 includes a first semiconductor region 282, preferably having a moderate p-type, or alternatively, n-type dopant concentration. For example, when the finished semiconductor chip is to predominantly include n-type field effect transistors ("NFETs"), the first semiconductor region 282 preferably has a moderate p-type dopant concentration, such as to correspond with the dopant concentration of the channel regions of NFET devices which are formed later therein. An insulating layer 284, preferably silicon dioxide, also covers the semiconductor region 282, at a bond surface of the bond wafer 280. The thus constituted base wafer 270 and bond wafer 280 are then joined and a portion of the bond wafer 280 is then thinned, by well-known techniques, e.g., polishing and/or cleaving, to form the SOI wafer 290. The resulting SOI wafer 290 has a thin SOI layer 301 overlying a buried oxide or "BOX" layer 303, which in turn overlies a bulk region 305 of the substrate including the n-type doped layer 272.

An alternative method of initially forming the SOI wafer 290 having the n-type doped layer 272 is through a "SIMOX" process in which the BOX layer 303 is formed by implantation of oxygen-containing species into the semiconductor region below the top surface layer 301 of the substrate 290, followed by annealing. In such alternative method, one begins with a substrate or wafer preferably having a single bulk region of n+ type conductivity. A lightly n-type doped layer is epitaxially grown onto the n+bulk region. The substrate or wafer is subjected to SIMOX processing to form the buried oxide layer such that the upper surface of the BOX layer is disposed at or above the interface of the interface of the n+ doped bulk region and the lightly doped epitaxial layer. The SOI layer 301 is then disposed in the lightly doped epitaxial layer above the BOX layer 303.

FIG. 8 illustrates a subsequent stage of processing in which a pad structure 292 is formed to overlie the SOI layer 301, the pad structure preferably including a "pad oxide" 294 being a thin (illustratively, less than about 10 nm) layer of oxide contacting the SOI layer 301, and a "pad nitride" 296, preferably a thicker layer (illustratively, 120 nm or more) layer of silicon nitride disposed over the pad oxide. For ease of illustration and description, the pad structure 292 will be referred to hereinafter as a unit unless otherwise noted. Thereafter, a hard mask layer (not shown) and a photoresist layer are then deposited, in order, to overlie the pad structure 292 and then patterned by photolithography, after which the photoresist pattern is transferred to the hard mask layer. The SOI substrate 290 including the pad structure 292 is then etched, as by RIE, to form trench 300 which extends through the pad structure 292, the SOI layer 301, BOX layer 303 and into the n-doped layer 272 of the substrate. The hard mask layer is then removed such that the structure appears as shown. Trench 300 is merely one of many trenches 300 (FIG. 6) of an array of trenches simultaneously etched into the substrate 290.

FIG. 9 illustrates a stage of processing after a lower portion 310 of the trench 300, disposed in the doped semiconductor layer 272, is widened to produce a bottle-shaped trench 300. Such processing can be performed, for example, by a process which etches the doped semiconductor layer 272 faster than the pad structure 292, SOI layer 301, and BOX layer 303.

Figure 11:
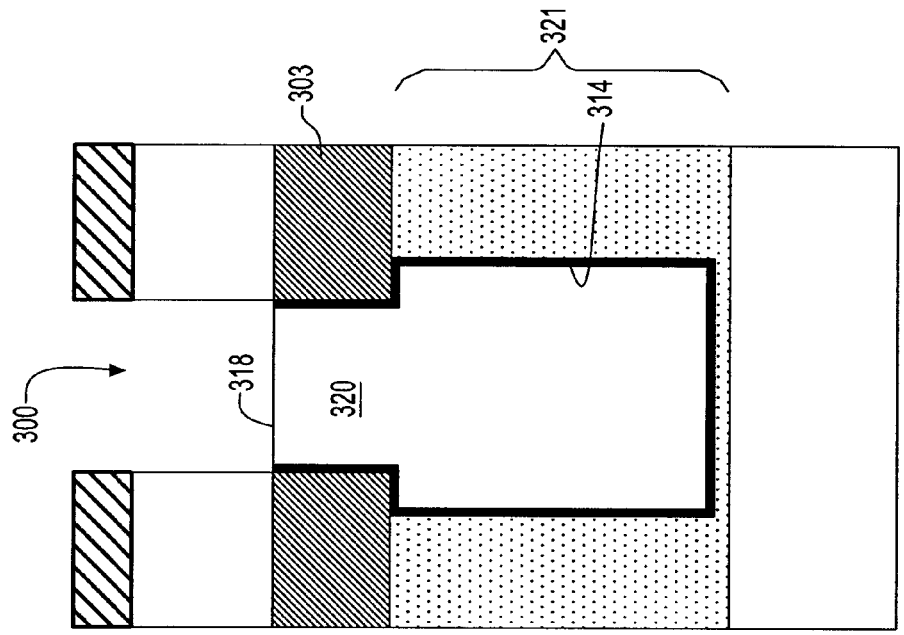
Figure 10:
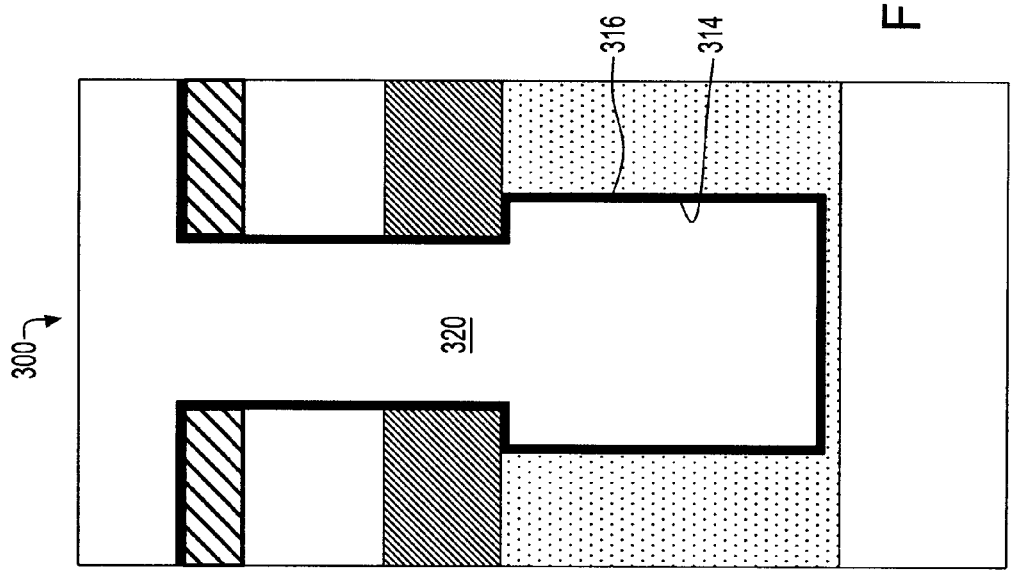

FIG. 10 illustrates a subsequent stage of processing after a node dielectric 314 is deposited to extend along a sidewall 316 of the trench 300, and a conductive material is thereafter deposited to fill the trench 300 for use as a node electrode/node conductor 320. Preferably, in order to provide work function matching between the node electrode inside the trench and the semiconductor material of the doped layer 272 (which functions as the buried plate), the conductive material consists essentially of n-type doped polysilicon. Subsequently, as shown in FIG. 11, the doped polysilicon fill is recessed to a level 318 at or below an upper edge of the BOX layer 303, as by etching selectively to the material of the node dielectric 314, followed by removing the node dielectric exposed thereby from the sidewall of the SOI layer 301 and pad structure 292 by etching. At this stage of processing, the combination of the buried plate present in the doped layer 272, the node dielectric 314 and the node electrode 320 inside the trench 300 make up a trench capacitor 321.

Figure 12:
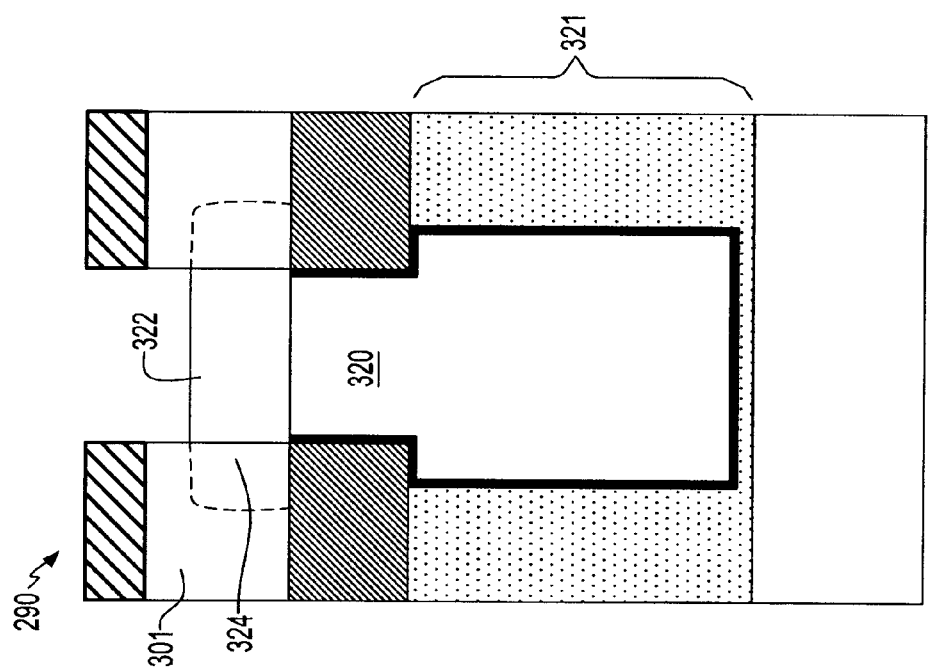

Subsequently, as shown in FIG. 12, a further layer 322 of n+ doped polysilicon is deposited within the trench 300 as an extension of the node conductor 320 and as a source of dopant ions. Thereafter, the substrate 290 is heated for a period of time and at a temperature sufficient to drive dopant ions from the layer 322 into the neighboring SOI layer 301 to form a buried strap outdiffusion 324. Such buried strap outdiffusion will be used to provide a conductive connection between the trench capacitor 321 and the SOI layer 301.

Figure 13:
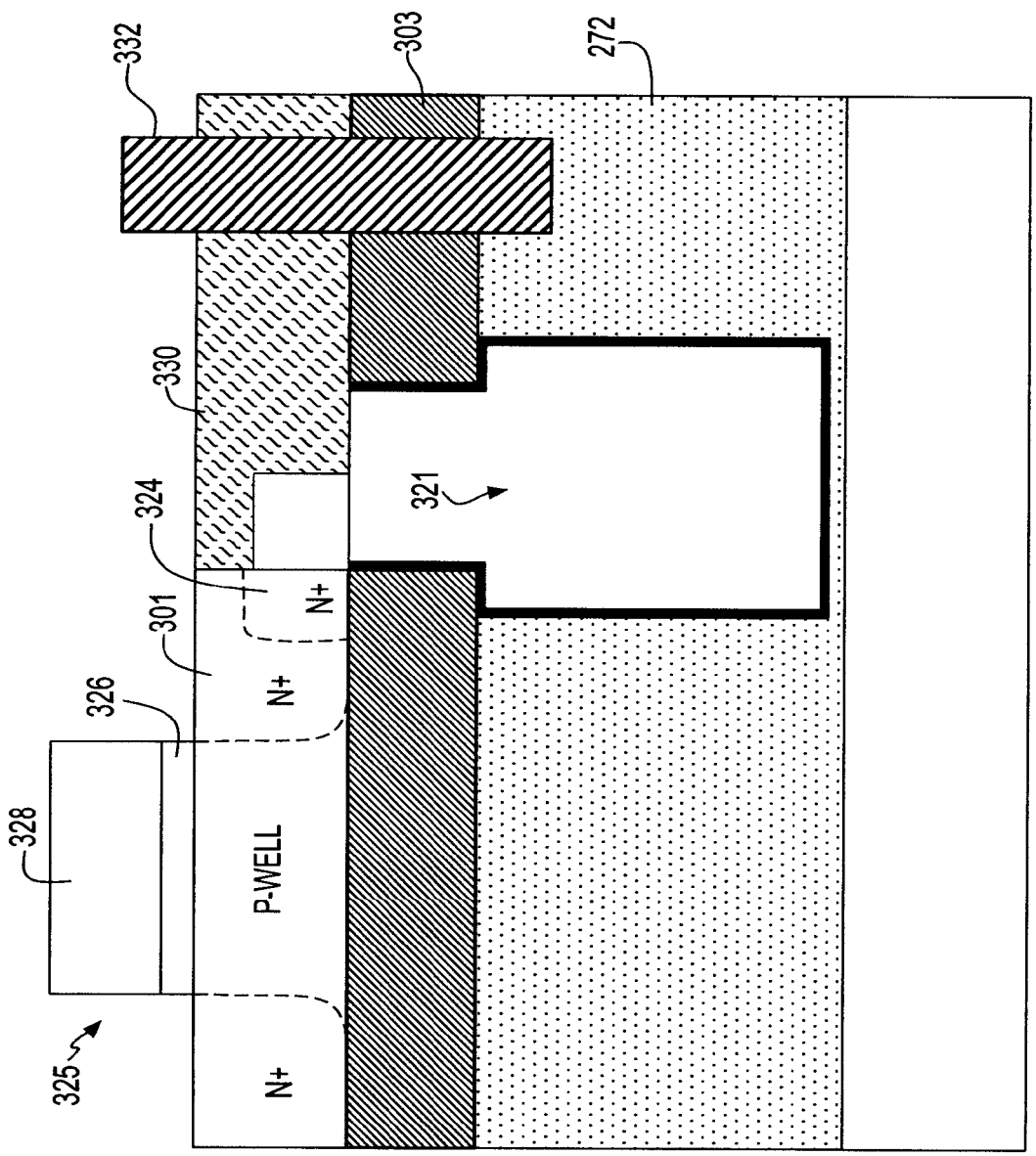

Referring to FIG. 13, additional processing is then conducted to form a planar n-type field effect transistor ("NFET") 325 having a conduction channel in the SOI layer 301, the NFET 325 being conductively connected to the trench capacitor 321 through the buried strap outdiffusion 324. During such processing, the pad structure that once covered the SOI layer 301 is removed. Many different techniques are available for forming the NFET 325, which are well-understood and need not be repeated here. A shallow trench isolation ("STI") region 330 is also formed to partially overlie the trench capacitor 321 in place of the SOI layer 301 on a side of the trench capacitor 321 opposite the NFET 325. The markings "N+" and "P-well" in the SOI layer 301 denote the doped regions of the SOI layer which make up the source/drain regions and the channel region or "body" of the NFET, respectively. The NFET also includes a gate dielectric 326 overlying the channel region and a gate conductor 328 overlying the gate dielectric 326. Finally, a conductive contact 332 extends from a location above the STI region 330 through the STI region 330 into the buried plate semiconductor layer 272 to conductively connect the buried plate semiconductor layer to a source of common potential such as ground. Alternatively, the contact 332 connects the semiconductor layer 272 to a common substrate bias potential other than ground. Such contact is illustratively formed by patterning an opening in a layer of photoresist (not shown) and transferring the patterned opening as by RIE, first to form a contact hole through the STI region 330, the BOX layer 303 and then into the buried plate layer 272 below the STI region 330. Thereafter, the contact hole is filled with a conductive material such as a metal, a conductive compound of a metal, doped polysilicon or some combinations thereof to form a conductive contact via.

Alternatively, when the STI region 330 is not present, a contact hole is patterned in the SOI layer 301, after which a sidewall of the contact hole is lined with an insulator. Then, the lined contact hole is filled with a conductive material to form the conductive contact via.

Another embodiment of the invention, in which the trench capacitor is connected to a vertical NFET formed in an SOI layer 401 instead of a planar NFET, will now be described with reference to FIG. 14. FIG. 14 illustrates a structure of a completed memory cell 450 which includes a vertical NFET 440 disposed along a sidewall of a trench 400 overlying a trench capacitor 430. In the example shown in FIG. 14, the vertical transistor 440 includes a gate conductor 434, a gate dielectric 436 and a channel region 435. The channel region 436 allows current to pass only when the gate conductor 434 is biased at an appropriate voltage. The gate conductor 434 is separated from a node electrode 420 of the trench capacitor 430 by a trench top oxide 432. The vertical transistor 440 is conductively connected to the node electrode 420 by an n-type buried strap conductor 422 disposed in a hole etched into the BOX layer 403. A buried strap outdiffusion 424 extends inside the SOI layer 401 as a source/drain region of the transistor 440 which is self-aligned to a buried strap conductor 422 disposed in an annular hole etched into the BOX layer 403. In this case, the buried strap outdiffusion 424 and buried strap conductor preferably extend as continuous annular regions surrounding the sidewall of the trench 400. As further shown in FIG. 14, another source/drain region 444 of the transistor 440 is disposed as a doped region of the SOI layer 401. An array top oxide ("ATO") region 445 provides an insulating layer overlying the SOI layer 401. A wordline 455, preferably including a patterned polysilicon line 454, extends over the structure in contact with the gate conductor fill 434, the wordline 455 having insulating sidewall spacers 456 and an insulating cap 458, both of which are preferably formed of silicon nitride. Preferably, an additional insulating spacer 459, preferably formed of silicon nitride, lines the sidewall of the portion of the trench 400 extending through the ATO 445 and the source/drain region 444 of the transistor. As further shown in FIG. 14, the source/drain region 444 is conductively contacted from above by a conductive bitline contact via 446 which extends through the ATO 445.

Figure 17:
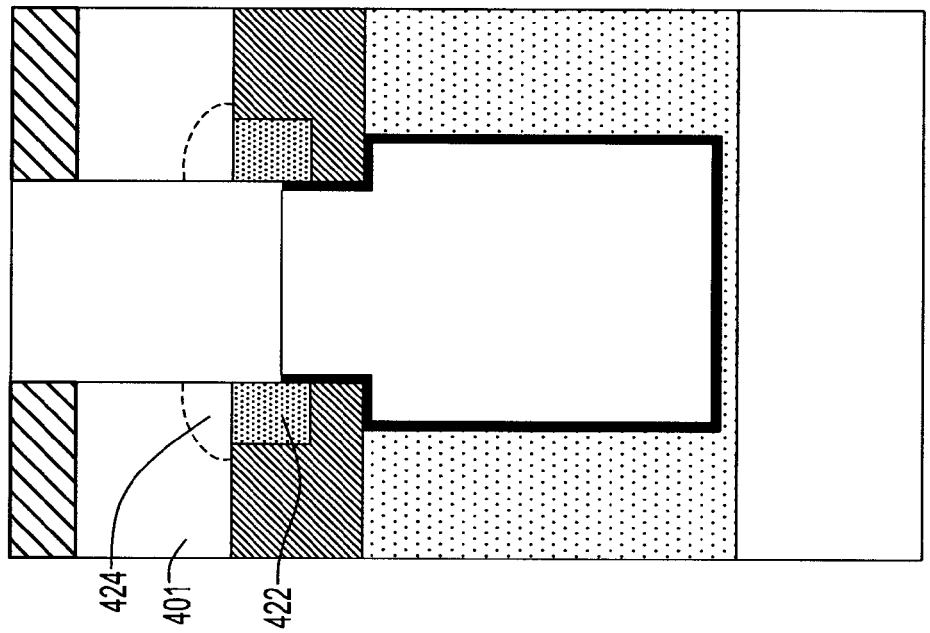
Figure 16:
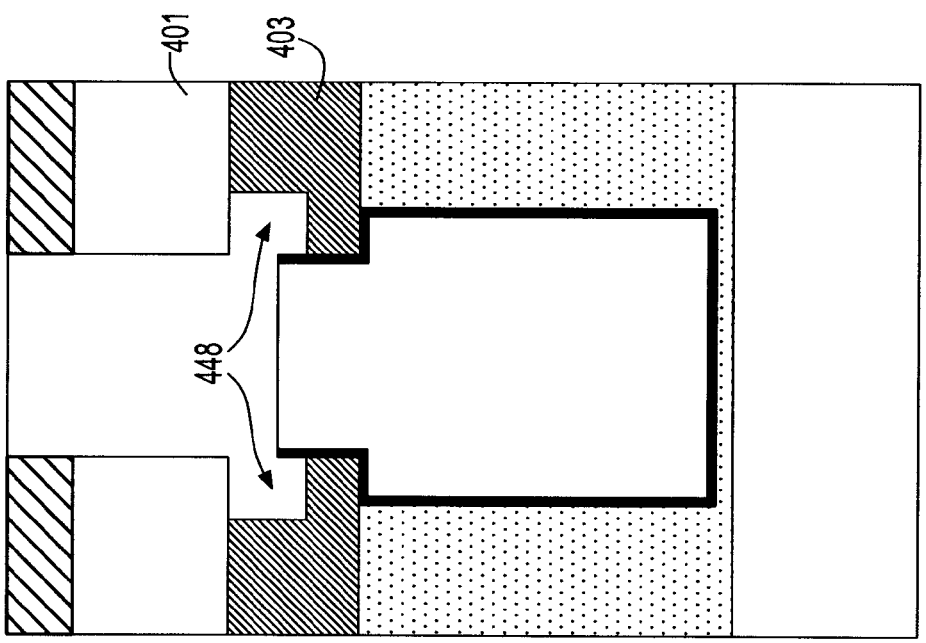

A preferred method of fabricating the memory cell will now be described with reference to FIGS. 15-17. The formation of the SOI wafer having a pad structure 392, SOI layer 401, BOX layer 403 and doped semiconductor layer 372 and etching of a trench 400 is as described above with reference to FIGS. 7-8 and processing to fabricate a trench capacitor 430 is as described above with reference to FIGS. 9-10. Thereafter, as shown in FIG. 15, the node conductor 420 is recessed to a level 402 below the upper edge 404 of the BOX layer 403, after which the exposed node dielectric 414 is removed from the SOI layer 401 and exposed portion of the BOX layer 403. Thereafter, the exposed portion of the BOX layer 403 is "undercut", i.e., etched outwardly from under the SOI layer 401, as by isotropic etching, to form an opening 448 in the BOX layer 403. The resulting opening 448 has an annular shape surrounding the location of the original sidewall of the trench 400. Subsequently, as shown in FIG. 17, a layer of n+ doped polysilicon is then deposited to fill the annular opening and the trench 400, and then recessed again to leave a buried strap conductor 422 remaining within the opening. Annealing can then be performed either immediately thereafter, or at a subsequent stage of processing to drive a dopant, e.g., arsenic, from the buried strap conductor 422 into the SOI layer 401 to form the buried strap outdiffusion 424 self-aligned to the buried strap conductor. Thereafter, further processing is performed according to well-known techniques to form a vertical NFET extending along the sidewall of the trench above the trench capacitor, e.g., such as the methods described in any one of commonly owned U.S. Pat. Nos. 6,426,252 B1; 6,566,177 B1 or 6,833,305 B2.

Figure 18:
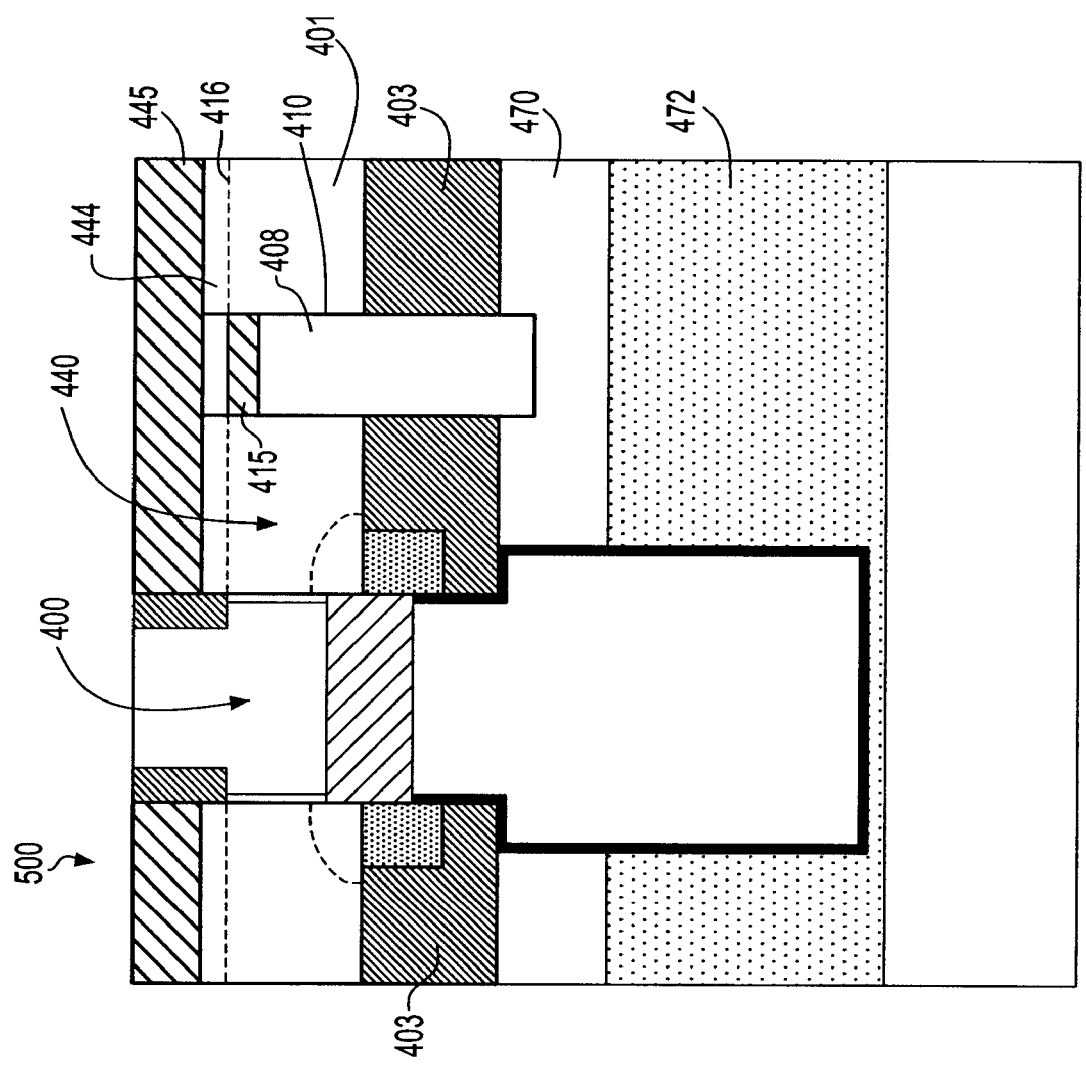
FIG. 18 illustrates a structure and method of forming a body-contacted memory cell of an array of memory cells in accordance with a fourth embodiment of the invention.

FIG. 18 illustrates a memory cell 500 according to another embodiment of the invention in which a conductive body contact 408 extends between a buried p-type doped layer 470 underlying the BOX layer 403 and a p-type doped well region 405 of the SOI layer which forms the body of the vertical NFET 440. While the memory cell 500 preferably includes a conductive bitline contact via and a wordline, as shown and described above relative to FIG. 14, for ease of illustration, these elements are omitted from FIG. 18. The p-type doped layer 470 is formed as an additional epitaxial or polycrystalline layer of silicon overlying the n-type doped layer 472 of the base wafer (270; FIG. 7) prior to forming the oxide layer (278; FIG. 7) and bonding the base wafer to the bond wafer and thinning the bond wafer side to form the SOI wafer. The p-type doped layer 470 preferably extends over all of the area in which the array of trenches 400 are disposed, and is maintained at a desirable potential by an additional conductive contact (not shown) which extends through the ATO, such as may be provided at an edge (not shown) of the array of trenches or a few discrete locations within the array.

The conductive body contact via 408 is preferably formed at a time prior to deposition of the ATO 445. The fabrication of the conductive body contact illustratively includes lithographically patterning an opening in a resist layer and in an underlying hard mask layer (not shown) and/or an opening in the preexisting pad structure 392 (FIG. 15). Thereafter, the pattern is transferred to the SOI layer 401, and the BOX layer 403 to extend the opening into contact with the p-type doped layer 470. The opening 410 is then filled with a conductive material such as p-type doped polysilicon, a metal, a conductive compound of a metal or a combination thereof. The conductive material within the opening 410 is then recessed, after which an insulating layer 415, such as preferably includes silicon dioxide, silicon nitride or a combination thereof, is formed to overlie the conductive material which forms the conductive contact via 408. Optionally, the insulating layer 415 is subsequently recessed to a level above the bottom edge 416 of the source/drain region 444, and the portion of the opening above the insulating layer is then filled with n-type doped semiconductor material, e.g., as by deposition of polysilicon and/or epitaxial growth of the layer from the edges of the n-type doped source/drain region 444 at the opening.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A structure including an array of trench capacitors, comprising;
   a semiconductor-on-insulator substrate including a semiconductor-on-insulator ("SOI") layer, a buried oxide ("BOX") layer underlying the SOI layer and a buried semiconductor region extending downwardly from a lower boundary of the BOX layer;
   a unitary buried capacitor plate region within the buried semiconductor region, the unitary buried capacitor plate region extending downwardly from the lower boundary of the BOX layer; and
   an array of trench capacitors, each trench capacitor including a node dielectric layer extending along an inner wall of a trench extending downwardly into the unitary buried capacitor plate region.

2. The structure as claimed in claim 1, wherein the unitary buried capacitor plate region extends throughout substantially all of an area of the substrate, the unitary buried capacitor plate region consisting essentially of at least one of a polycrystalline semiconductor material or an amorphous semiconductor material.

3. The structure as claimed in claim 2, wherein the buried semiconductor region further comprises a second unitary semiconductor region underlying the unitary buried capacitor plate region, the unitary buried capacitor plate region has a first single conductivity type selected from n-type and p-type and the second unitary semiconductor region has a second single conductivity type being a conductivity type selected from n-type and p-type opposite the first single conductivity type.

4. A memory cell array structure including the structure as claimed in claim 3, further comprising an array of transistors disposed in a single-crystal region of the substrate, the array of transistors including transistors conductively connected to individual ones of the trench capacitors of the array of trench capacitors.

5. The structure as claimed in claim 3, wherein the unitary buried capacitor plate region includes silicon germanium and the second unitary semiconductor region does not include silicon germanium.

6. The structure as claimed in claim 1, further comprising a conductive contact via extending through the BOX layer into the unitary buried capacitor plate region, the conductive contact via having a depth substantially equal to a depth of the trenches of the array and having a diameter substantially greater than a diameter of the trenches of the array.

7. A memory cell array structure including the structure as claimed in claim 1, further comprising an array of transistors disposed in a single-crystal region of the substrate, the array of transistors including transistors conductively connected to individual ones of the trench capacitors of the array of trench capacitors.

8. The structure as claimed in claim 1, further comprising a second semiconductor region extending downwardly from the BOX layer within the buried semiconductor region, the second semiconductor region disposed laterally adjacent to the unitary buried capacitor plate region, wherein the unitary buried capacitor plate region has a first single conductivity type selected from n-type or p-type and the second semiconductor region has a second single conductivity type selected from n-type and p-type, the second single conductivity type being opposite the first single conductivity type.

9. A structure including an array of trench capacitors, comprising:
- a substrate including a semiconductor region;
- an array of trench capacitors, each trench capacitor including a node dielectric layer extending along an inner wall of a trench disposed within the semiconductor region, each trench capacitor sharing a common unitary buried capacitor plate having only a first single conductivity type selected from n-type and p-type; and
- a conductive contact via extending into the semiconductor region, the conductive contact via having a depth substantially equal to a depth of the trench capacitors.

10. The structure as claimed in claim 9, wherein the conductive contact via has a width substantially greater than a width of the trench capacitors.

11. The structure as claimed in claim 9, wherein the substrate further comprises a buried oxide ("BOX") layer, and a surface layer consisting essentially of a single-crystal semiconductor overlying the BOX layer, wherein the semiconductor region is a buried semiconductor region underlying the BOX layer.

* * * * *